United States Patent
Ni et al.

(10) Patent No.: US 11,538,132 B2
(45) Date of Patent: Dec. 27, 2022

(54) APPLICATION AND INTEGRATION OF A GPU SERVER SYSTEM

(71) Applicant: Quanta Computer Inc., Taoyuan (TW)

(72) Inventors: Hsiao-Tsu Ni, Taoyuan (TW); Yaw-Tzorng Tsorng, Taoyuan (TW); Chun Chang, Taoyuan (TW); Ta-Wei Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 337 days.

(21) Appl. No.: 16/818,843

(22) Filed: Mar. 13, 2020

(65) Prior Publication Data

US 2021/0201435 A1 Jul. 1, 2021

Related U.S. Application Data

(60) Provisional application No. 62/954,370, filed on Dec. 27, 2019.

(51) Int. Cl.
| | |
|---|---|
| H05K 7/14 | (2006.01) |
| G06F 1/18 | (2006.01) |
| H05K 5/02 | (2006.01) |
| H05K 5/03 | (2006.01) |
| G06T 1/20 | (2006.01) |
| G06F 9/38 | (2018.01) |
| G06F 15/78 | (2006.01) |

(52) U.S. Cl.
CPC ............... *G06T 1/20* (2013.01); *G06F 1/181* (2013.01); *G06F 9/3885* (2013.01); *G06F 15/78* (2013.01); *H05K 5/02* (2013.01); *H05K 5/03* (2013.01); *H05K 7/1418* (2013.01); *H05K 7/1485* (2013.01); *H05K 7/1489* (2013.01); *H05K 7/1491* (2013.01)

(58) Field of Classification Search
None
See application file for complete search history.

(56) References Cited

U.S. PATENT DOCUMENTS

| | | | |
|---|---|---|---|
| 10,133,302 B2 * | 11/2018 | Yuan | H05K 7/1491 |
| 10,212,842 B1 * | 2/2019 | Schulze | H05K 7/1452 |
| 10,420,247 B2 * | 9/2019 | Chen | A47F 1/00 |
| 2015/0156902 A1 * | 6/2015 | Terwilliger | H05K 7/1487 403/321 |
| 2017/0367211 A1 * | 12/2017 | Easton | H05K 5/04 |

* cited by examiner

*Primary Examiner* — James Wu
*Assistant Examiner* — Christopher L Augustin
(74) *Attorney, Agent, or Firm* — Nixon Peabody LLP

(57) ABSTRACT

A graphics processing unit (GPU) server having a GPU host head with one or more host graphics processing units (GPUs). The GPU server further has a GPU system with a plurality of system GPUs that are separate from the host GPUs, and that are configured to rapidly accelerate creation of images for output to a display device. The GPU server also has a mounting assembly that integrates the GPU host head and the GPU system into a single GPU server unit. The GPU host head is independently movable relative to the GPU system.

18 Claims, 14 Drawing Sheets

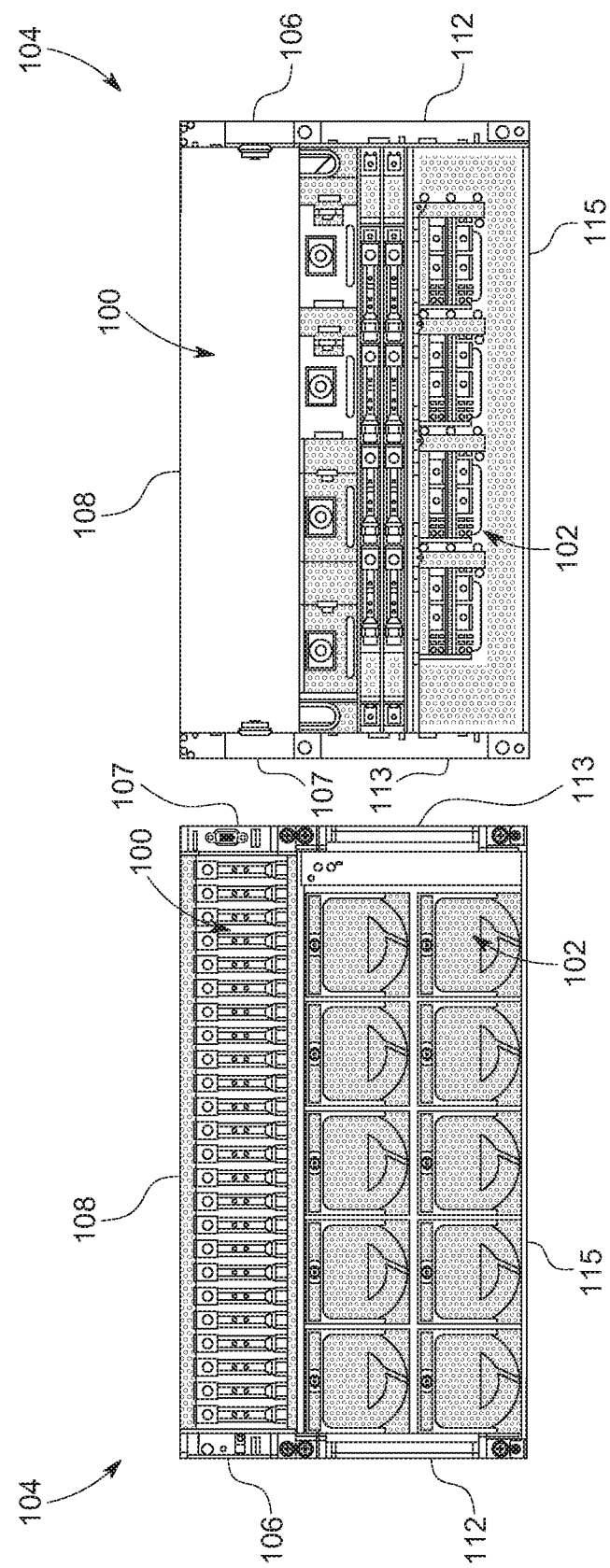

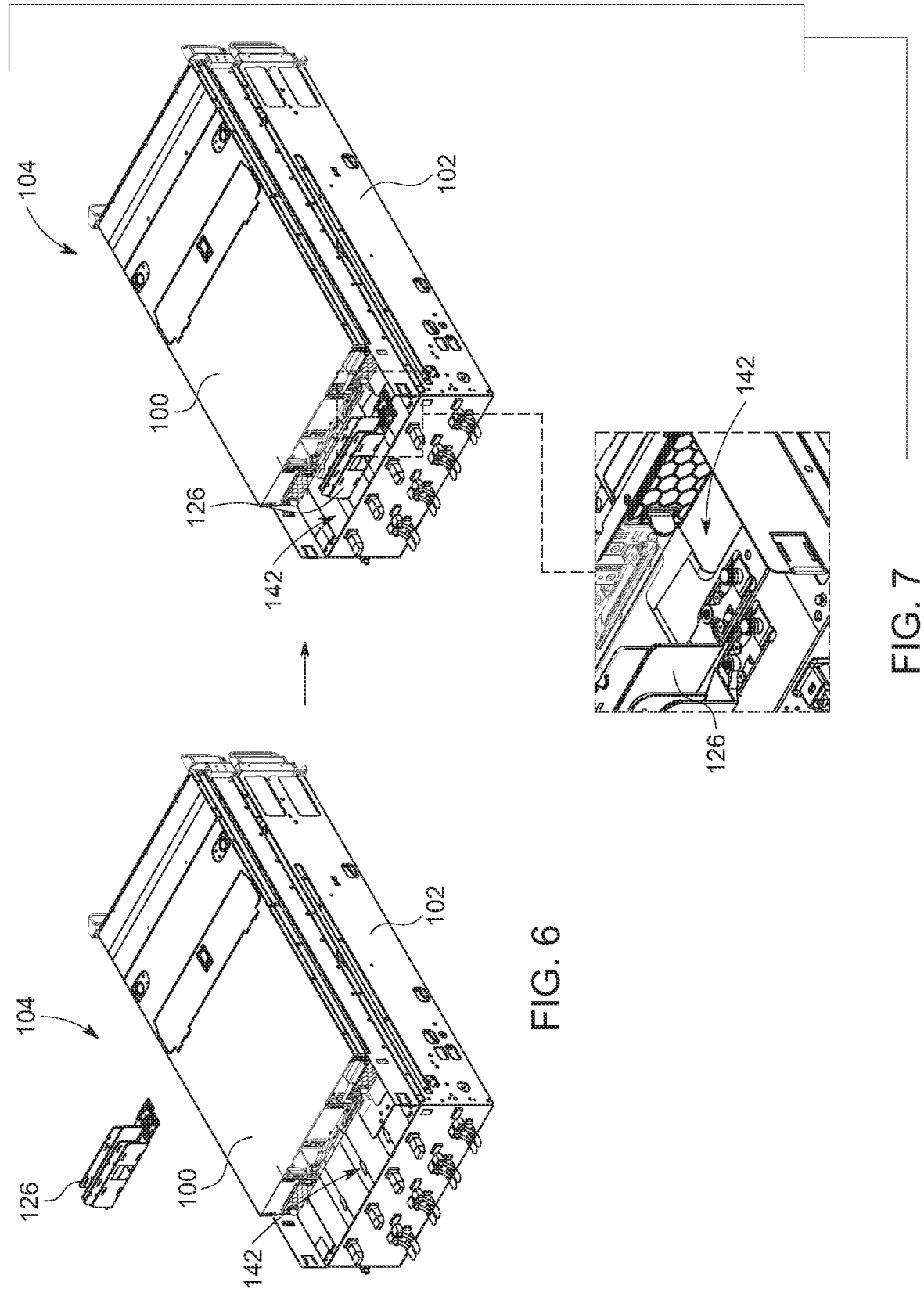

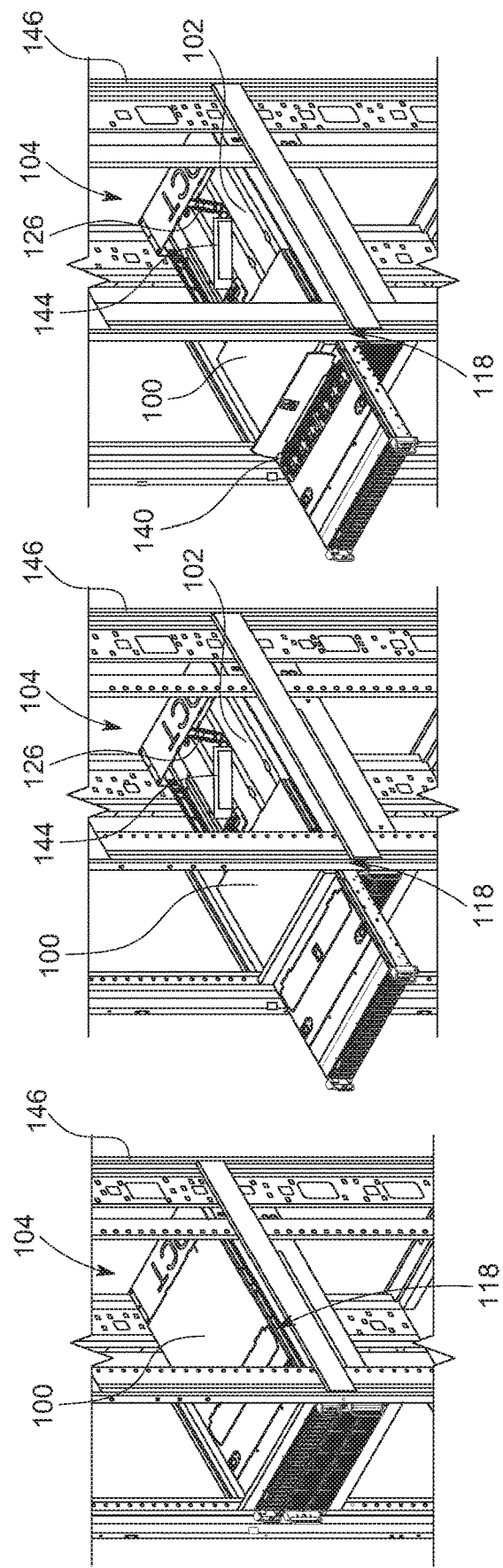

APPLICATION AND INTEGRATION OF A GPU SERVER SYSTEM

CROSS-REFERENCE TO RELATED APPLICATIONS

This application claims priority under 35 U.S.C. § 119 to and the benefit of U.S. Provisional Patent Application Ser. No. 62/954,370, filed on Dec. 27, 2019, and titled "The Application and Integration of GPU Server System," which is incorporated herein by reference in its entirety.

FIELD OF THE INVENTION

The present invention relates generally to installation of a graphics processing unit ("GPU") system, and, more specifically, to integration of a GPU host head with a GPU system having one or more graphics processing units ("GPUs") into a GPU unit server.

BACKGROUND OF THE INVENTION

Present server systems are problematic because they typically require installation of individual major components that include a host head and one or more GPUs, which are separate from the host head itself. The individual components limit installation efficiency and maintenance associated with the server system. For example, the installation of each such individual GPU requires setup of a respective chassis, thereby increasing setup time and expense.

Present server systems are further problematic because they also typically require cables that are routed external to respective support cages of the GPUs. These cables are costly and are poorly routed, thereby unnecessarily increasing expenses and management time for properly routing the cables when installing, removing, or otherwise managing the server systems.

The present disclosure is directed to providing a server system that solves the above problems and other needs.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a graphics processing unit (GPU) server has a GPU host head with one or more host graphics processing units (GPUs). The GPU server further has a GPU system with a plurality of system GPUs that are separate from the host GPUs. The system GPUs are configured to rapidly accelerate creation of images for output to a display device. The GPU server also has a mounting assembly that integrates the GPU host head and the GPU system into a single GPU server unit. The GPU host head is independently movable relative to the GPU system.

According to an implementation of the aspect disclosed above, the GPU host head has two GPUs, and the GPU system has four GPUs, the GPU server having a total of six GPUs. According to another implementation of the aspect disclosed above, the mounting assembly includes a pair of L-shaped frame brackets via which the GPU host head is mechanically connected to the GPU system.

According to a configuration of the implementation disclosed above, the pair of L-shaped frame brackets includes a left bracket and a right bracket. Each of the L-shaped frame brackets has a vertical wall that is mechanically connected to a respective side wall of the GPU host head. Each of the L-shaped frame brackets further has a horizontal wall that is mechanically connected to a top surface of the GPU system.

According to yet another configuration of the implementation disclosed above, the GPU server further has a pair of host rails. Each host rail is fastened to a respective side wall of the GPU host head via one or more removable fasteners. The GPU server further has a pair of bracket rails. Each bracket rail is fastened to a respective one of the pair of L-shaped frame bracket via one or more permanent fasteners. According to a more specific configuration, the one or more removable fasteners are screws, and the one or more permanent fasteners are rivets.

According to yet another configuration of the implementation disclosed above, the GPU server further has a cable management arm (CMA) that is attached on a top surface of the GPU system near a rear surface of the GPU system. According to a more specific configuration, an enclosure cover is mounted over the CMA, the enclosure having two sides that are attached to respective rear ends of the pair of L-shaped frame brackets. According to another specific configuration, the enclosure cover includes two spring latches that are configured to removably attach the enclosure cover to the respective rear ends of the pair of L-shaped frame brackets.

According to yet another implementation of the aspect disclosed above, the GPU host head has a movable cover that swings between a closed position and an open position. The movable cover protects, in the closed position, one or more fans that are mounted within the GPU host head.

According to a configuration of the above implementation, the movable cover includes a latch that has a locked position and an unlocked position. According to another configuration of the above implementation, the movable cover swings along a rotation shaft that is mounted to a top surface of the GPU host head.

According to yet another implementation of the aspect disclosed above, the GPU server further has a power supply unit (PSU) cage that is attached between the GPU host head and the GPU system. The PSU cage overlays over a majority of a top surface of the GPU system.

According to yet another implementation of the aspect disclosed above, the GPU server has a hard disk drive (HDD) cage that is attached to a rear surface of the GPU system.

According to another aspect of the present disclosure, a method is directed to assembling a graphics processing unit (GPU) server. The method includes providing a GPU host head with one or more host graphic processing units (GPUs). The method also includes providing a GPU system with a plurality of system GPUs that are separate from the host GPUs. The system GPUs are configured to rapidly accelerate creation of images for output to a display device. The method further includes integrating, via a mounting assembly, both the GPU host head and the GPU system into a single GPU server unit. The GPU host head is independently movable relative to the GPU system.

According to an implementation of the aspect disclosed above, the method further includes attaching a first L-shaped frame bracket to a first side of the GPU host head and to a top surface of the GPU system. The method also includes attaching a second L-shaped frame bracket to a second side of the GPU host head and to the top surface of the GPU system.

According to a configuration of the implementation disclosed above, the method includes removably fastening a first host rail between the first L-shaped frame bracket and the first side of the GPU host head. The method also includes removably fastening a second host rail between the second L-shaped frame bracket and the second side of the GPU host head. The method further includes permanently fastening a first bracket rail on an exterior surface of the first L-shaped frame bracket. The method further includes permanently fastening a second bracket rail on an exterior surface of the second L-shaped frame bracket.

According to another implementation of the aspect disclosed above, the method further includes attaching a cable management arm (CMA) to a top surface of the GPU system near a rear surface of the GPU system. The method also includes mounting an enclosure cover over the CMA.

According to yet another implementation of the aspect disclosed above, the method further includes mounting a movable cover to a top surface of the GPU host head, the movable cover rotating between a closed position and an open position. The method also includes providing a latch on the movable cover for locking or unlocking the movable cover relative to the GPU host head.

According to yet another implementation of the aspect disclosed above, the method further includes attaching a power supply unit (PSU) cage between the GPU host head and the GPU system. The method also includes attaching a hard disc drive (HDD) cage to a rear surface of the GPU system.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

FIG. 2 is a front view of the single GPU server unit.

FIG. 3 is a rear view of the single GPU server unit.

FIG. 6 is a perspective view of the single GPU server unit before attaching a CMA.

FIG. 7 is a perspective view of the single GPU server unit with an enlarged view showing attachment of the CMA.

FIG. 8 is a perspective view illustrating the single GPU server unit mounted in a frame rack.

FIG. 9 is a perspective view illustrating the single GPU server unit of FIG. 8 with a host head drawn out for fan maintenance.

FIG. 10 is a perspective view illustrating the single GPU server unit of FIG. 9 with a movable cover in an open position for accessing a fan.

Figure 1:
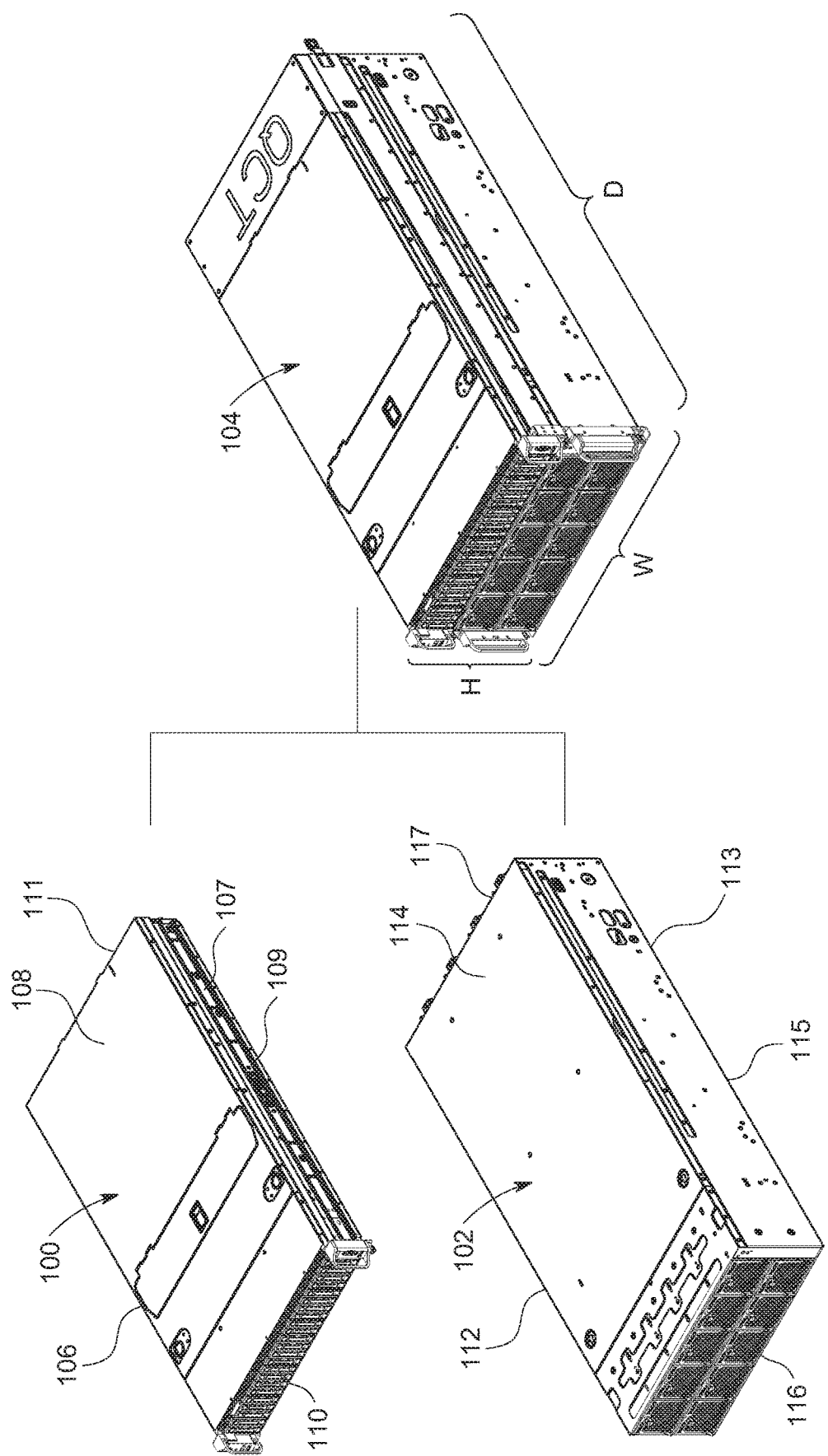
FIG. 1 is a perspective view illustrating a single GPU server unit with integrated GPU host head and GPU system.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure generally describes a graphics processing unit (GPU) server that integrates into a single GPU server unit two components that were previously provided separately. Specifically, the GPU server integrates a GPU host head that is configured for computation of relative work and a GPU system that is configured to rapidly accelerate the creation of images for output to a display device. The GPU host head includes one or more host graphics processing units (GPUs), and the GPU system includes a plurality of system GPUs.

The integration of the GPU host head with the GPU system improves operation behavior, including, for example, providing a faster setup in a frame rack. The faster setup is facilitated at least because the integrated GPU server unit requires installation of a single chassis (relative to the previous requirement of installing two chassis).

According to another example, the disclosed GPU server is beneficial at least because it further facilies easy management of cables. For example, the disclosed GPU server facilitates simple management of a mini serial-attached SCSI (SAS) high-definition (HD) cable, which is easily routed internally within the GPU server (relative to previous externally routed cables). Additionally, the internal mini-SAS HD cable is less expensive than a comparative external mini-SAS HD cable. Thus, the disclosed GPU server reduces clutter and expenses associated with messy and expensive external cables.

Referring to FIGS. 1-3, a GPU host head 100 is integrated with a GPU system 102 to form a single GPU server unit 104. The GPU host head 100 includes one or more host GPUs and the GPU system 102 includes a plurality of system GPUs. The system GPUs are configured to rapidly accelerate the creation of images for output to a display device.

According to one example, the GPU host head 100 has two GPUs and the GPU system 102 has four GPUs. Thus, according to this example, the GPU server unit 104 has a total of six GPUs.

The GPU host head 100 has a pair of side walls that include a left side wall 106 and a right side wall 107. The side walls 106, 107 extend along a depth dimension D between a top surface 108 and a bottom surface 109. The side walls 106, 107 further extend along a height dimension H between a front surface 110 and a rear surface 111. The side walls 106, 107 are separated from each other by a width dimension W. The GPU host head 100 includes associated hardware components that generally from a respective chassis.

The GPU system 102 also has a pair of side wall that include a left side wall 112 and a right side wall 113. The side walls 112, 113 extend along the depth dimension D between a top surface 114 and a bottom surface 115. The side walls 112, 113 further extend along the height dimension H between a front surface 116 and a rear surface 117. The side walls 112, 113 are separated from each other by a width dimension W. The GPU system 102 includes associated hardware components that generally from a respective chassis.

Figure 4:
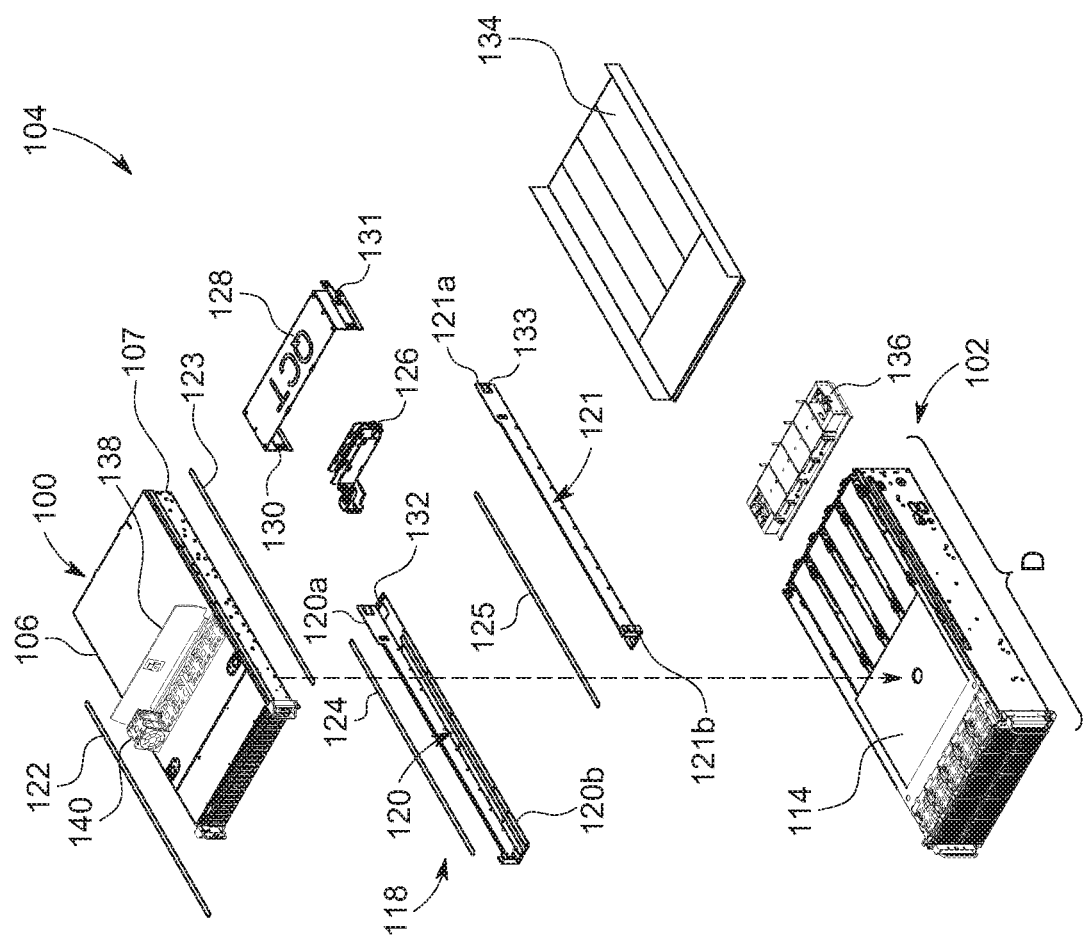
FIG. 4 is an exploded view of the single GPU server unit.

Referring to FIG. 4, the GPU host head 100 is integrated with the GPU system 102 via a mounting assembly 118 that includes several components, including two L-shaped frame brackets. The two L-shaped frame brackets include a left bracket 120 and a right bracket 121. Each bracket 120, 121 has a respective vertical wall 120a, 121a and a respective horizontal wall 120b, 121b. For ease of disclosure, the terms "vertical" and "horizontal" are used in reference to one orientation of the brackets 120, 121. However, it is understood that the left and right brackets 120, 121 can be used in orientations in which the vertical and horizontal walls 120a, 121a, 120b, 121b are not necessarily "vertical" and/or "horizontal."

The left and right brackets 120, 121 extend along the depth dimension D and are mechanically connected to the GPU server unit 104. The vertical wall 120a of the left bracket 120 is mechanically connected to the left side wall 106 of the GPU host head 100. The vertical wall 121a of the right bracket 121 is mechanically connected to the right side wall 107 of the GPU host head 100. The horizontal wall 120b of the left bracket 120 is mechanically connected to the top surface 114 of the GPU system 102. The horizontal wall 121b of the left bracket 120 is also mechanically connected to the top surface 114 of the GPU system 102.

The mounting assembly 118 further includes a pair of host rails 122, 123 and a pair of bracket rails 124, 125. The host rails 122, 123 includes a left host rail 122 and a right host rail 123. The left host rail 122 is fastened to the left side wall 106 of the GPU host head 100 via one or more removable fasteners. The right host rail 123 is fastened to the right side wall 107 of the GPU host head 100 via one or more removable fasteners. According to one example, the removable fasteners are screws.

The bracket rails 124, 125 include a left bracket rail 124 and a right bracket rail 125. The left bracket rail 124 is fastened to the left bracket 120, and the right bracket rail 125 is fastened to the right bracket 121. Both bracket rails 124, 125 are fastened via one or more permanent fasteners. According to one example, the permanent fasteners are rivets.

The GPU server unit 104 includes a cable management arm (CMA) 126 that is attached on the top surface 114 of the GPU system 102, near a rear surface 117 of the GPU system 102. The GPU server unit 104 further includes an enclosure cover 128 that is mounted over the CMA 126. The enclosure cover 128 has a general C-shape with two sides 130, 131 attached to respective rear ends 132, 133 of the pair of L-shaped frame brackets 120, 121.

The GPU server unit 104 further includes a power supply unit (PSU) cage 134 that is attached generally between the GPU host head 100 and the GPU system 102. The PSU cage 134 overlays a majority of the top surface 114 of the GPU system 102. The GPU server unit 104 further includes a hard disk drive (HDD) cage 136 that is attached near the rear surface 117 (in FIG. 1) of the GPU system 102.

The GPU host head 100 includes a movable cover 138 that swings between a closed position and an open position.

In the open position (illustrated in FIG. 4), one or more fans 140 are exposed from within the GPU host head 100. As such, in the open position the fans 140 can be retrieved (e.g., replaced) for maintenance or other purposes. In the closed position, the movable cover 138 protects the fans 140 when mounted within the GPU host head 100.

Figure 5:
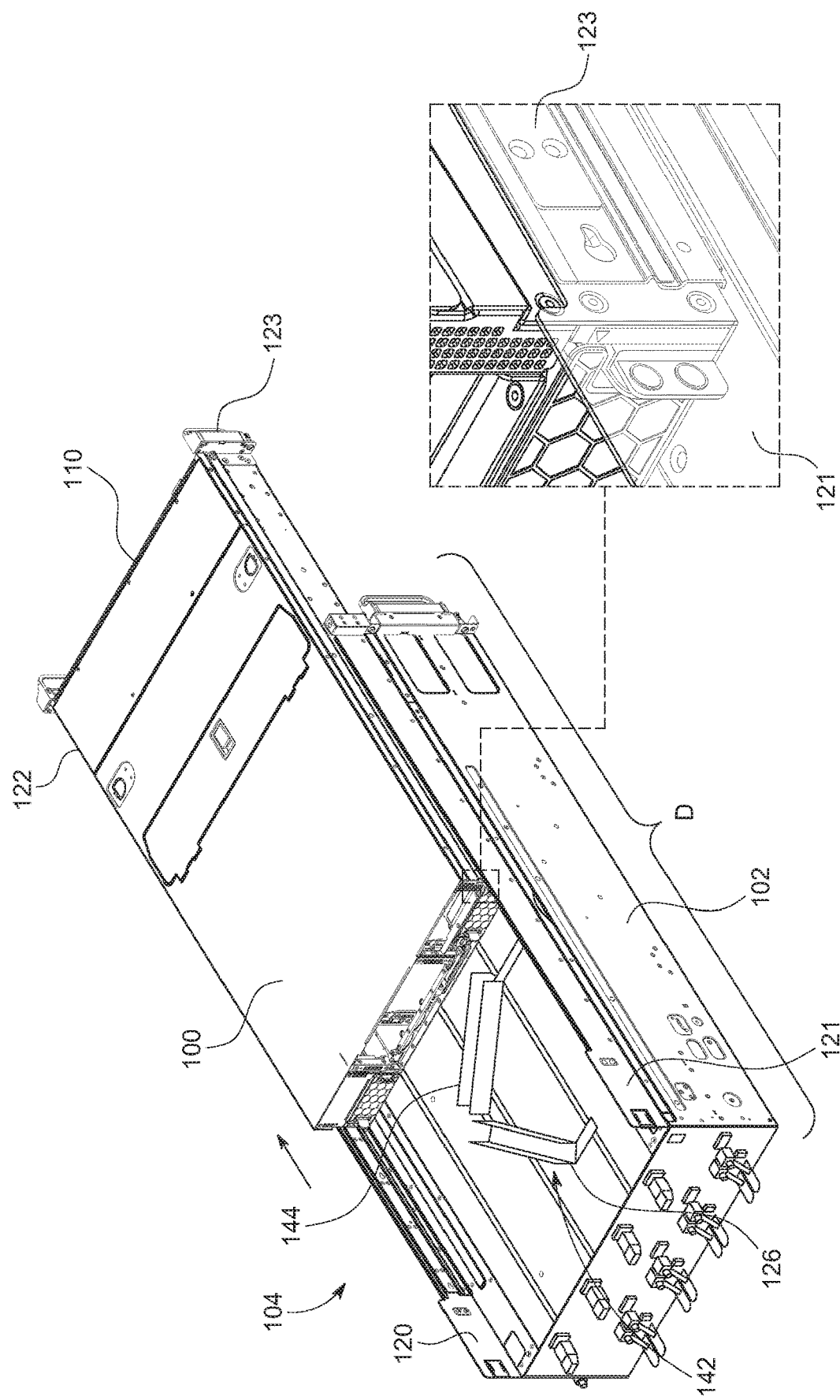
FIG. 5 is a perspective view of the single GPU server unit with an enlarged view showing attached rails.

Referring to FIG. 5, the GPU host head 100 is integrated with the GPU system 102 such that the GPU host head 100 moves independently, relative to the GPU system 102. Specifically, the host rails 122, 123 are frictionally movable, relative to the brackets 120, 121. Because the host rails 122, 123 are fixed to the GPU host head 100 and the brackets 120, 121 are fixed to the GPU system 102, the GPU host head 100 is slideable relative to the GPU system 102.

Specifically, the GPU host head 100 is slideable in a direction parallel to the depth dimension D towards the front surface 110, exposing a rear area 142 above the GPU system 102. When the GPU host head 100 is drawn out, the CMA 126 is attached or detached, as needed, for management purposes of cables 144.

Referring to FIGS. 6 and 7, the CMA 126 is attached to the rear area 142 of the GPU system 102. The CMA 126 is fixed to the top surface 114 of the GPU system 102 using a fastener, such as a plunger.

Referring to FIGS. 8-10, the GPU server unit 104 is installed in a frame rack 146. The mounting assembly 118 facilitates, for example, drawing out the GPU host head 100 for performing maintenance (e.g., servicing of fans 140). The mounting assembly 118 allows sliding movement of the GPU host head 100 relative to the GPU system 102. The drawing out of the GPU host head 100 is further facilitated by the CMA 126, which allows flexible routing of internal cables 144.

After drawing out the host head 100, as illustrated specifically in FIG. 9, the movable cover 138 is opened to reveal the fans 140. Then, maintenance personnel is able to remove or otherwise service the fans 140.

Figure 13:
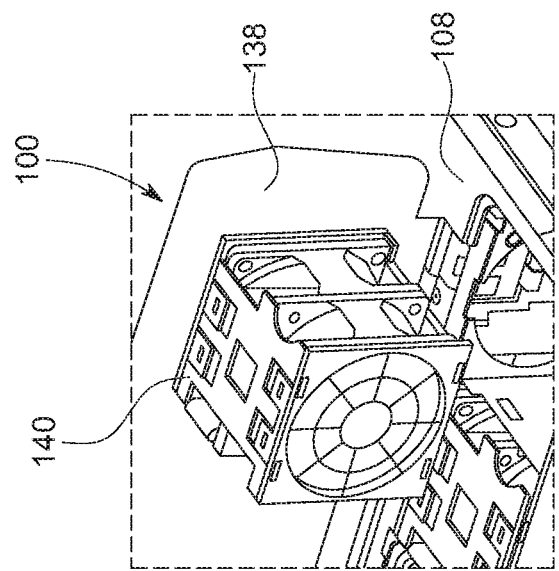
FIG. 13 is another enlarged view of FIG. 11 illustrating the removal of a fan for maintenance.
Figure 12:
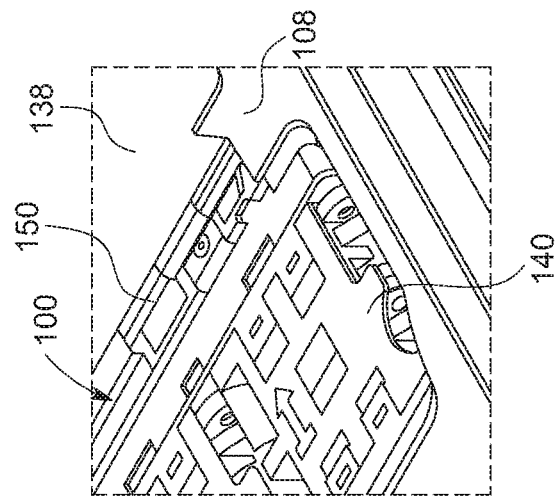
FIG. 12 is an enlarged view of FIG. 11 showing a rotation shaft of the movable cover.
Figure 11:
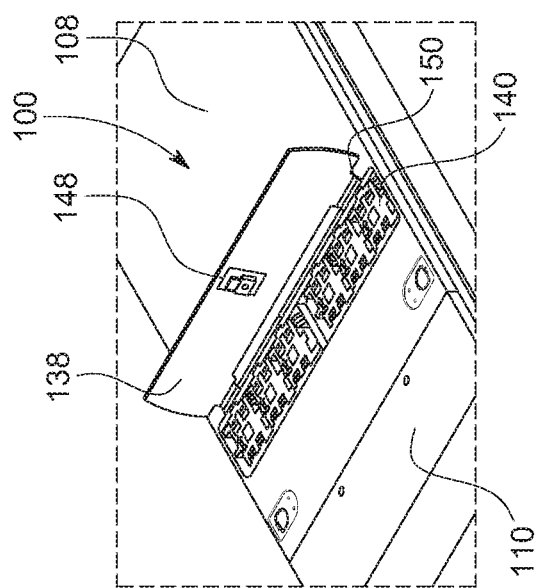
FIG. 11 is a perspective view illustrating the single GPU server unit with a latch of the movable cover in an unlocked position.
Figure 14:
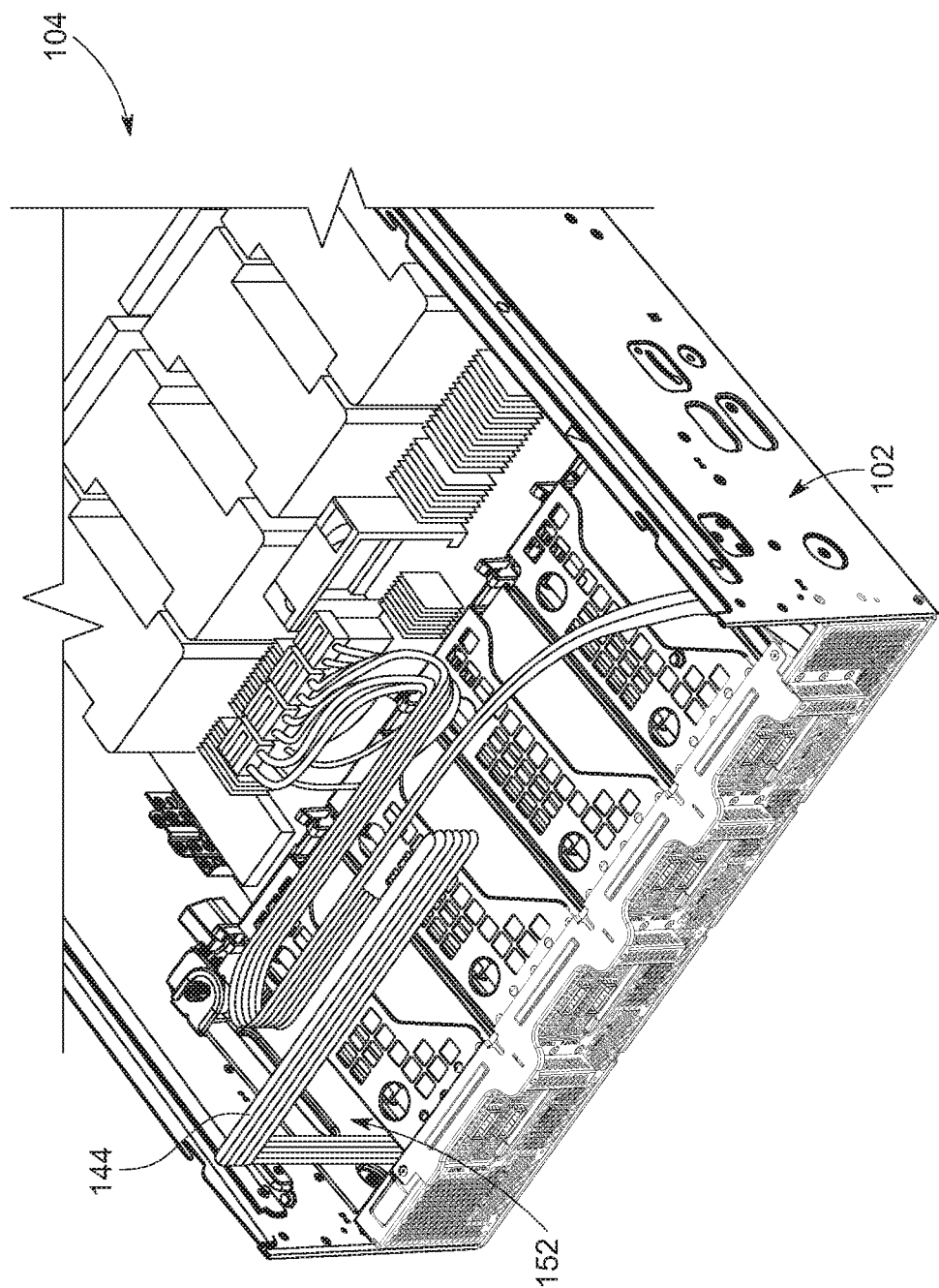
FIG. 14 is a perspective view of the single GPU server unit showing attachment of a cable to a switch board
Figure 15:
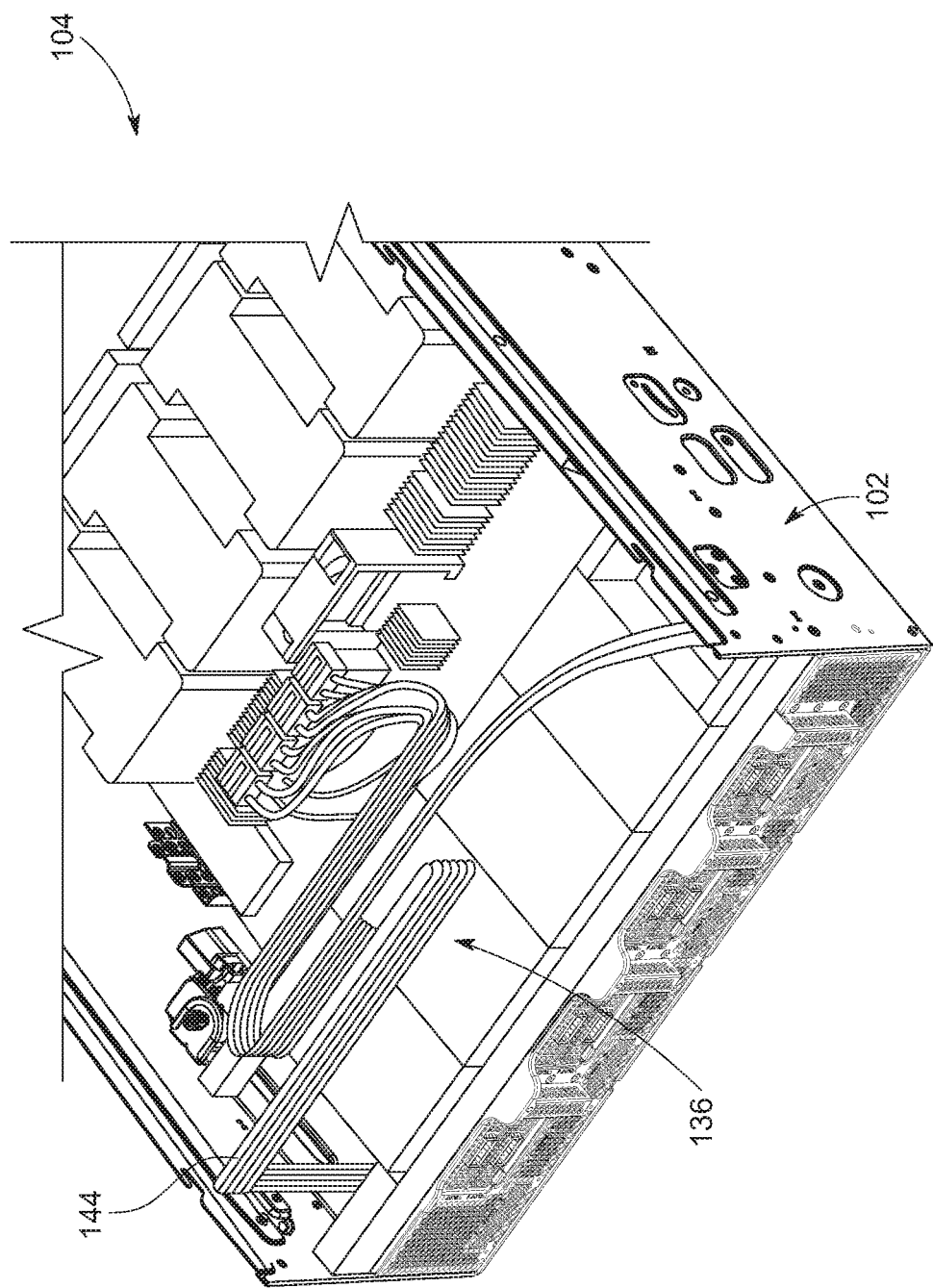
FIG. 15 is a perspective view of the single GPU server unit showing routing of the cable of FIG. 14 through an attached HDD cage.
Figure 16:
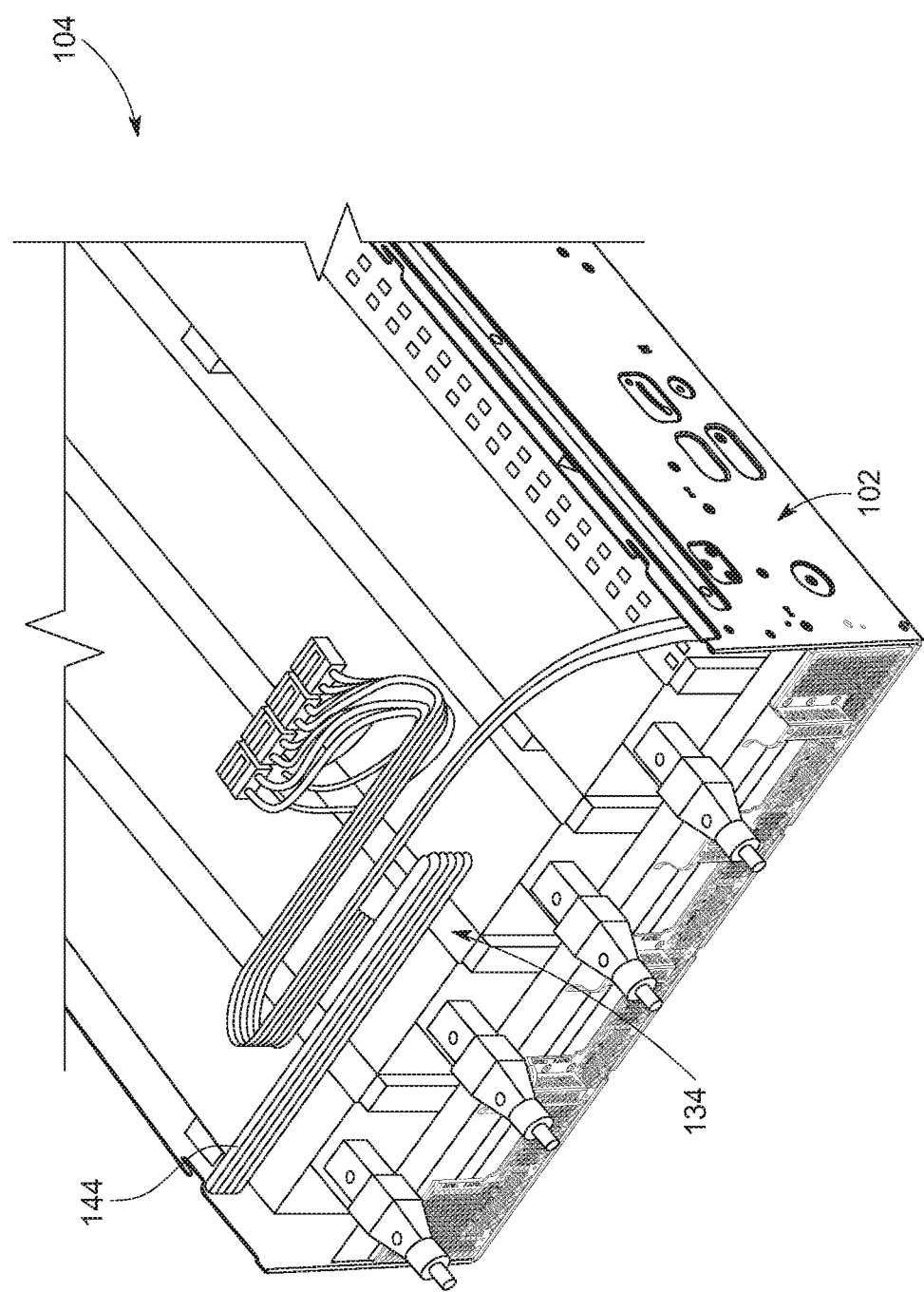
FIG. 16 is a perspective view of the single GPU server unit showing routing of the cable of FIG. 15 through an attached PSU cage.

Referring to FIGS. 11-13, access to one or more of the fans 140 is provided via the movable cover 138. The movable cover 138 includes a latch 148 that has a locked position and an unlocked position. In the locked position, the movable cover 138 is in its closed position in which the movable cover 138 is generally planar with the top surface 108 of the GPU host head 100. In the locked position, the movable cover 138 is temporarily fixed to the top surface 108 of the GPU host head 100. In the unlocked position of the latch 148, the movable cover 138 is released from being fixed to the top surface 108 of the GPU host head 100. When released, the movable cover 138 is now able to swing in a clockwise orientation away from the front surface 110 of the GPU host head 100. The swinging (or rotation) of the movable cover 138 is facilitated by and is around a rotation shaft 150. The opening of the movable cover 138 exposes the internal fans 140, which are consequently ready for service.

Referring generally to FIGS. 14-20, a cable routing path is provided to allow cables 144 (e.g., internal mini-SAS HD cables) to pass internally through the chassis of the GPU system 102, and then to be plugged into the GPU host head 100. Initially, referring specifically to FIG. 14, the cables 144 are initially plugged into a switch board 152. Then, the cables 144 are routed through the HDD case 136 (as illustrated specifically in FIG. 15) and the PSU cage 134 (as illustrated specifically in FIG. 16). The HDD cage 136 is configured to protect internal components generally related to hard disk drives. The PSU cage 134 is configured to protect internal components generally related to power supply units.

Figure 17:
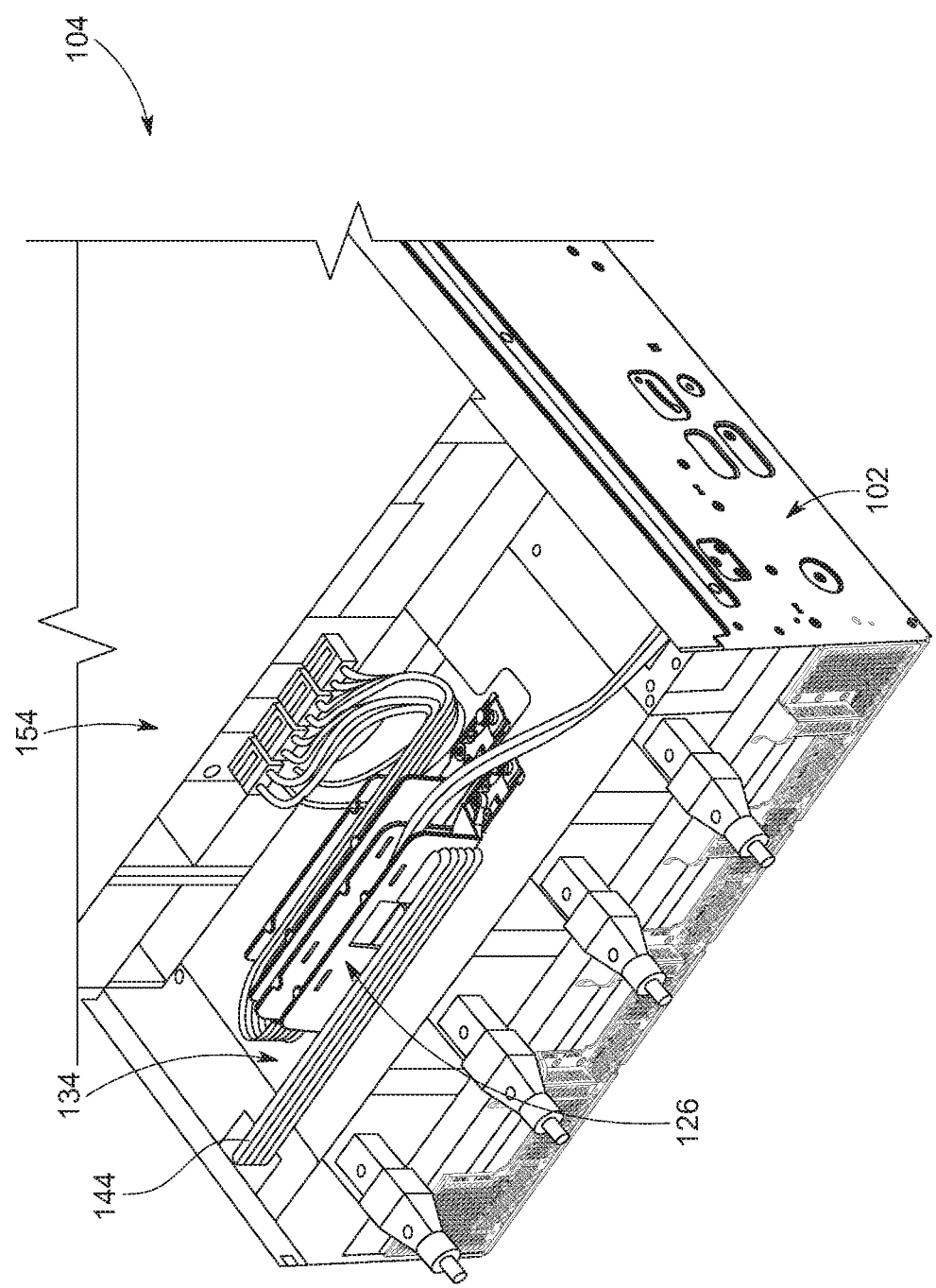
FIG. 17 is a perspective view of the single GPU server unit showing management of the cable of FIG. 16 via attached CMA.
Figure 18:
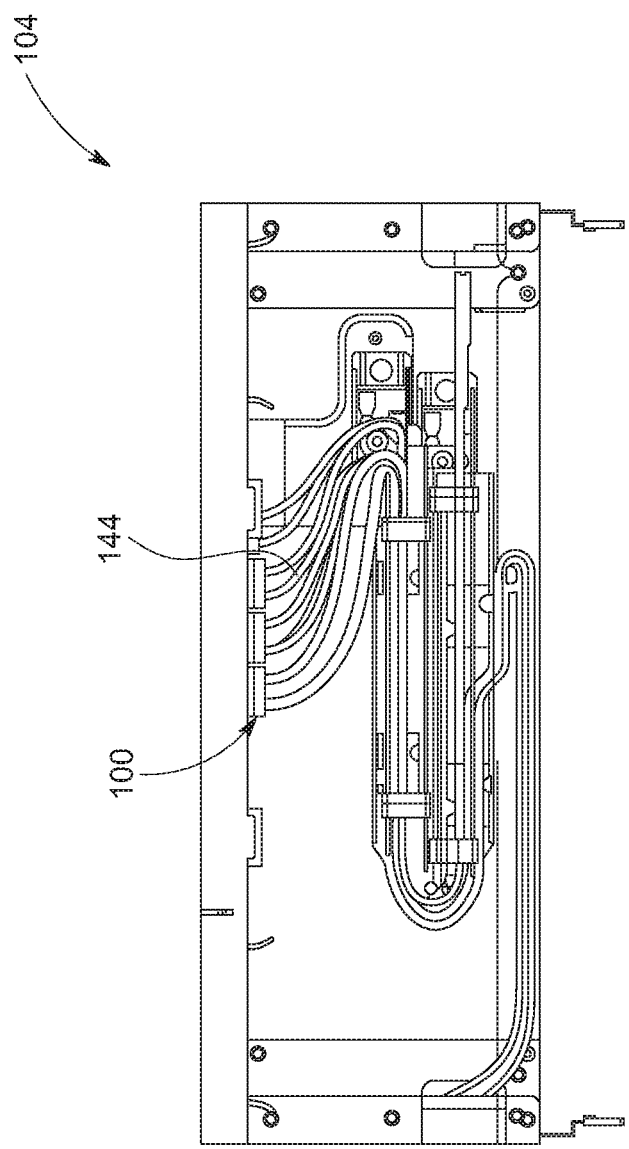
FIG. 18 is a top view of the single GPU server unit showing the cable of FIG. 17 plugged into a GPU host head.
Figure 19:
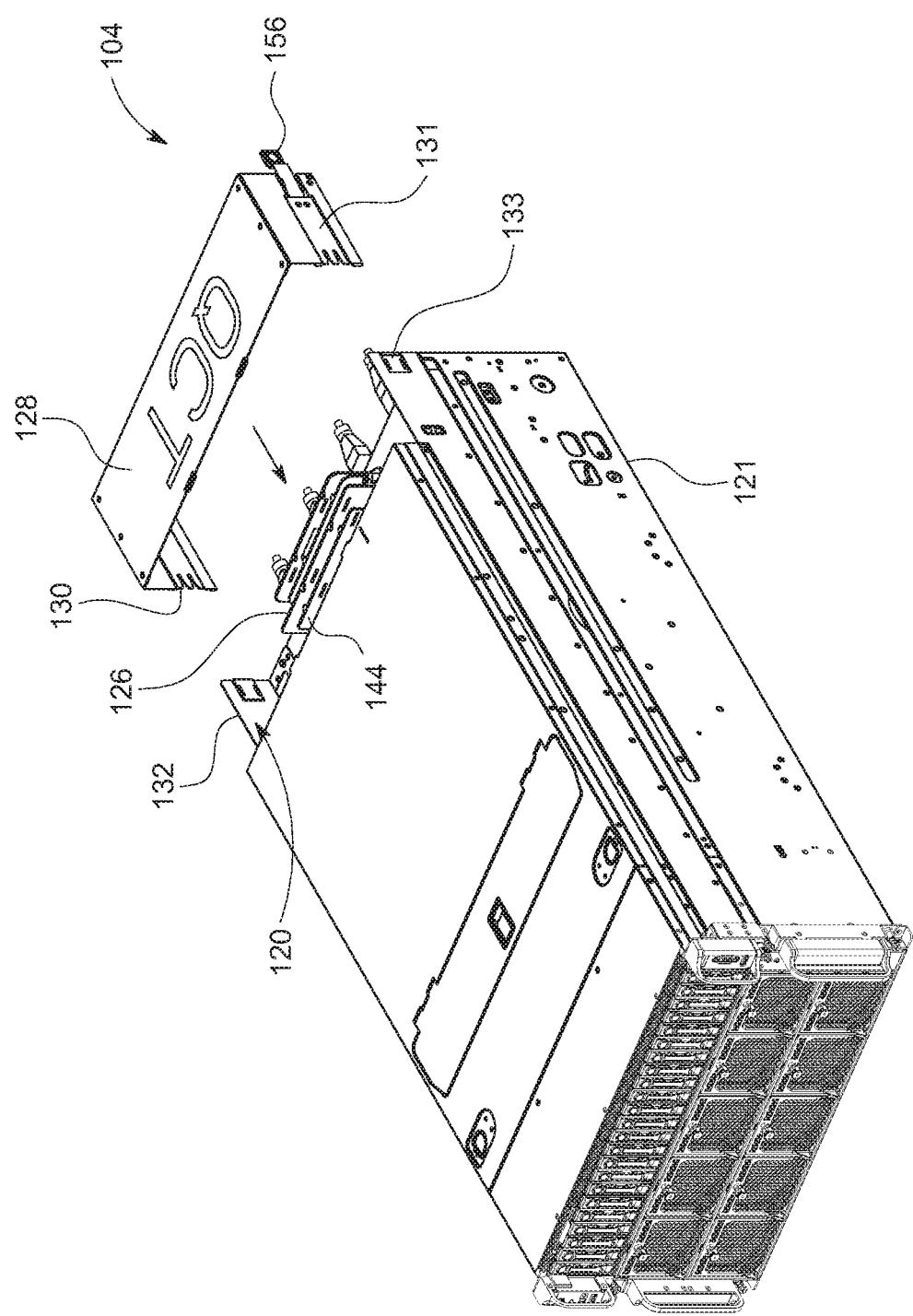
FIG. 19 is a perspective view of the single GPU server unit showing assembly of an enclosure cover.

Then, referring specifically to FIG. 17, the PSU cage 134 is set in place, along with a top cover 154. Any surplus cable length is managed via the CMA 126. Then, referring specifically to FIG. 18, the cables 144 are plugged into the GPU host head 100.

After completing the routing of the cables 144, the enclosure cover 128 is installed (as illustrated specifically in FIG. 19) to hide from view the cables 144 and the CMA 126. The two sides 130, 131 of the enclosure cover 128 include spring latches 156 for removably attaching the enclosure cover 128 to the respective rear ends 132, 133 of the pair of L-shaped frame brackets 120, 121. The spring latches 156 are generally identical to each other. The view of FIG. 19 only shows a right one of the spring latches 156 clearly.

Figure 20:
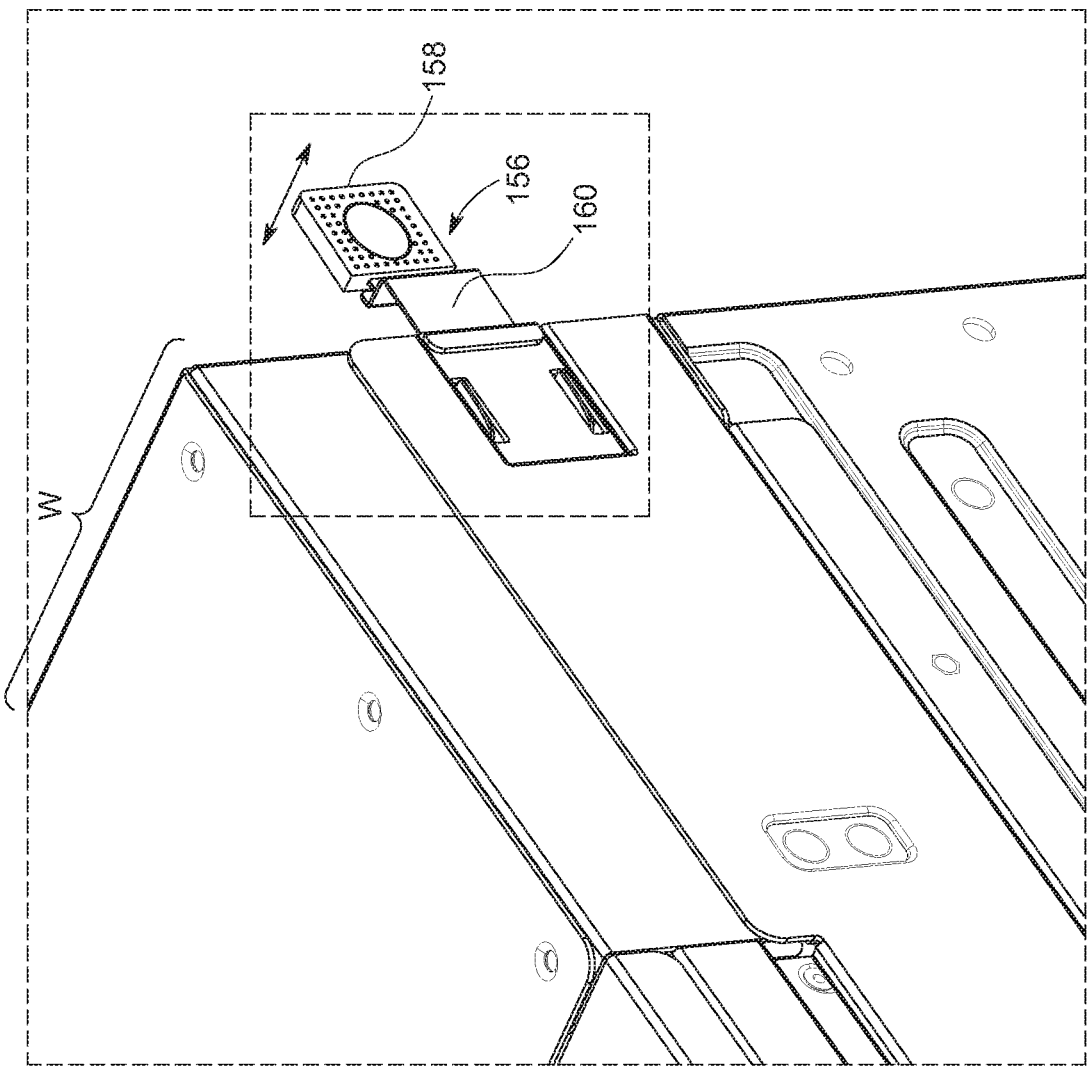
FIG. 20 is an enlarged view of FIG. 19 illustrating a latch of the enclosure cover.

Referring specifically to FIG. 20, the right one of the spring latches 156 is illustrated showing a grasp tab 158 that is movable in a direction along the width dimension W. The grasp tab 158 is coupled to an intermediate portion 160 that provides a springing motion to the spring latch 156. Manual movement of the spring latch 156, by holding the grasp tab 158, in a direction external to the GPU server 104 releases the enclosure cover 128. Then, the natural spring motion provided by the intermediate portion 160 returns the spring latch 156 to a securing position in which the enclosure cover 128 is typically attached to a respective bracket 120, 121.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A graphics processing unit (GPU) server comprising:
   a GPU host head having one or more host graphics processing units (GPUs);
   a GPU system having a plurality of system GPUs that are separate from the host GPUs, the system GPUs being configured to rapidly accelerate creation of images for output to a display device; and
   a mounting assembly that integrates the GPU host head and the GPU system into a single GPU server unit, the GPU host head being independently movable relative to the GPU system;
   wherein the mounting assembly includes a pair of L-shaped frame brackets via which the GPU host head is mechanically connected to the GPU system.

2. The GPU server of claim 1, wherein the GPU host head has two GPUs and the GPU system has four GPUs, the GPU server having a total of six GPUs.

3. The GPU server of claim 1, wherein the pair of L-shaped frame brackets includes a left bracket and a right bracket, each of the L-shaped frame brackets having
   a vertical wall mechanically connected to a respective side wall of the GPU host head, and
   a horizontal wall mechanically connected to a top surface of the GPU system.

4. The GPU server of claim 1, further comprising:
   a pair of host rails with each host rail fastened to a respective side wall of the GPU host head via one or more removable fasteners; and
   a pair of bracket rails with each bracket rail fastened to a respective one of the pair of L-shaped frame brackets via one or more permanent fasteners.

5. The GPU server of claim 4, wherein the one or more removable fasteners are screws and the one or more permanent fasteners are rivets.

6. The GPU server of claim 1, further comprising a cable management arm (CMA) attached on a top surface of the GPU system near a rear surface of the GPU system.

7. The GPU server of claim 6, further comprising an enclosure cover mounted over the CMA, the enclosure cover having two sides attached to respective rear ends of the pair of L-shaped frame brackets.

8. The GPU server of claim 7, wherein the enclosure cover includes two spring latches configured to removably attach the enclosure cover to the respective rear ends of the pair of L-shaped frame brackets.

9. The GPU server of claim 1, further comprising a hard disk drive (HDD) cage attached to a rear surface of the GPU system.

10. A graphics processing unit (GPU) server comprising:
    a GPU host head having one or more host graphics processing units (GPUs);
    a GPU system having a plurality of system GPUs that are separate from the host GPUs, the system GPUs being configured to rapidly accelerate creation of images for output to a display device; and
    a mounting assembly that integrates the GPU host head and the GPU system into a single GPU server unit, the GPU host head being independently movable relative to the GPU system;
    wherein the GPU host head has a movable cover that swings between a closed position and an open position, the movable cover protecting in the closed position one or more fans mounted within the GPU host head.

11. The GPU server of claim 10, wherein the movable cover includes a latch that has a locked position and an unlocked position.

12. The GPU server of claim 10, wherein the movable cover swings along a rotation shaft that is mounted to a top surface of the GPU host head.

13. A graphics processing unit (GPU) server comprising:
    a GPU host head having one or more host graphics processing units (GPUs);
    a GPU system having a plurality of system GPUs that are separate from the host GPUs, the system GPUs being configured to rapidly accelerate creation of images for output to a display device;
    a mounting assembly that integrates the GPU host head and the GPU system into a single GPU server unit, the GPU host head being independently movable relative to the GPU system; and
    a power supply unit (PSU) cage attached between the GPU host head and the GPU system, the PSU cage overlaying over a majority of a top surface of the GPU system.

14. A method for assembling a graphics processing unit (GPU) server, the method comprising:
    providing a GPU host head with one or more host graphic processing units (GPUs);
    providing a GPU system with a plurality of system GPUs that are separate from the host GPUs, the system GPUs being configured to rapidly accelerate creation of images for output to a display device;
    integrating via a mounting assembly both the GPU host head and the GPU system into a single GPU server unit, the GPU host head being independently movable relative to the GPU system;
    attaching a cable management arm (CMA) to a top surface of the GPU system near a rear surface of the GPU system; and
    mounting an enclosure cover over the CMA.

15. The method of claim 14, further comprising:
    attaching a first L-shaped frame bracket to a first side of the GPU host head and to a top surface of the GPU system; and
    attaching a second L-shaped frame bracket to a second side of the GPU host head and to the top surface of the GPU system.

16. The method of claim 15, further comprising:
    removably fastening a first host rail between the first L-shaped frame bracket and the first side of the GPU host head;
    removably fastening a second host rail between the second L-shaped frame bracket and the second side of the GPU host head;
    permanently fastening a first bracket rail on an exterior surface of the first L-shaped frame bracket; and
    permanently fastening a second bracket rail on an exterior surface of the second L-shaped frame bracket.

17. The method of claim 14, further comprising:
    mounting a movable cover to a top surface of the GPU host head, the movable cover rotating between a closed position and an open position; and
    providing a latch on the movable cover for locking or unlocking the movable cover relative to the GPU host head.

18. The method of claim 14, further comprising:
attaching a power supply unit (PSU) cage between the GPU host head and the GPU system; and
attaching a hard disk drive (HDD) cage to a rear surface of the GPU system.

* * * * *